United States Patent [19]

Haines

[11] 4,343,874
[45] Aug. 10, 1982

[54] METHOD OF CONSTRUCTING A HOLOGRAM ON A PHOTORESIST DETECTOR

[75] Inventor: Kenneth A. Haines, San Jose, Calif.

[73] Assignee: Eidetic Images, Inc., Santa Clara, Calif.

[21] Appl. No.: 208,246

[22] Filed: Nov. 19, 1980

[51] Int. Cl.³ .................................................. G03C 5/00
[52] U.S. Cl. .................................................. 430/1; 430/2; 350/3.6; 350/3.61; 350/3.81; 350/3.83; 350/3.84
[58] Field of Search ............... 430/1, 2; 350/3.6, 3.61, 350/3.81, 3.83, 3.84

[56] References Cited
U.S. PATENT DOCUMENTS

| 3,729,634 | 4/1973 | Jensen et al. | 350/3.6 |
| 3,755,677 | 8/1973 | Paul et al. | 350/3.6 |
| 4,032,338 | 6/1977 | Gange | 350/3.61 |

OTHER PUBLICATIONS

Iwata et al., Applied Optics, Jun. 1974, vol. 13, No. 6, pp. 1327-1336.
Bartolini, Applied Optics, vol. 13, No. 1, Jan. 1974, 129-139.
Beesley et al., Applied Optics, vol. 9, No. 12, Dec. 1970, pp. 2720-2724.
Bartolini et al., Applied Optics, vol. 9, No. 10, 1970, pp. 2283-2290.
Bartolini et al., Journal of the Electrical Chemical Society, vol. 120, No. 10, pp. 1408-1413, Oct. 1973.

*Primary Examiner*—Jack P. Brammer
*Attorney, Agent, or Firm*—Limbach, Limbach & Sutton

[57] ABSTRACT

A photoresist holographic technique in which the object modified and reference beam are of substantially the same average intensity, the photoresist is exposed for a long period of time and subsequently developed for a very short period of time.

11 Claims, 4 Drawing Figures

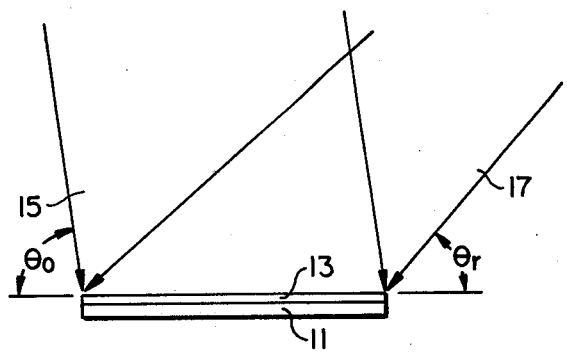
FIG._1.
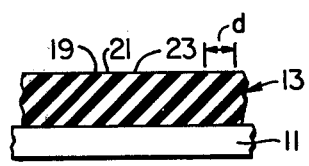
FIG._2.
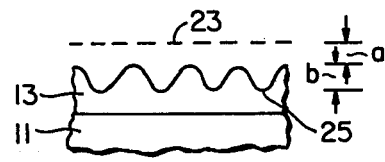
FIG._3.
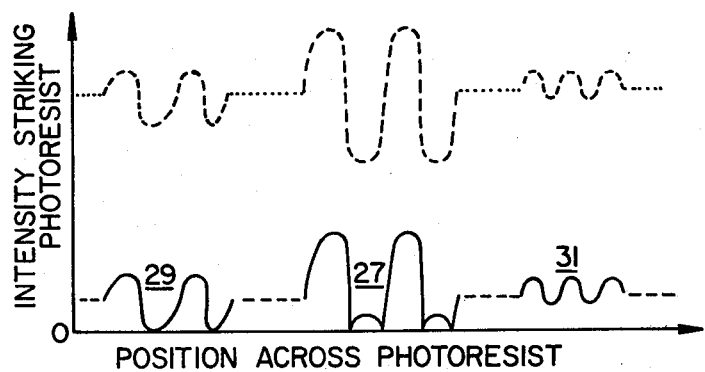
FIG._4.

METHOD OF CONSTRUCTING A HOLOGRAM ON A PHOTORESIST DETECTOR

BACKGROUND OF THE INVENTION

This invention relates to improvements in techniques of constructing optical holograms in photoresist detector material.

Photoresist material has long been used and written about as a holographic recording medium. The holographic pattern formed from the intersection of two coherent radiation beams is applied to photoresist material and selectively alters the material in accordance with the intensity variation of the holographic interference pattern. Both positive and negative photoresist material can be used for this purpose. After exposure, the photoresist is developed by etching its surface to form a surface relief pattern corresponding to that of the intensity pattern to which the photoresist material was exposed. If a positive photoresist material is utilized, which is the most prevalent, the portions of the detector which are exposed to high intensity radiation are removed faster than those portions which are not. The resulting surface relief hologram reconstructs an image of the object by refracting or reflecting light incident on it into the various order beams.

Currently utilized techniques expose the photoresist material for as short a time as possible with an intensity in the reference beam that is many times the average intensity of the object modified beam across the photoresist detector. It is taught in the literature that the high reference to object modified beam intensity ratio is necessary to minimize distortion by operating on a linear portion of the photoresist characteristic curve. The amount of light energy to which the photoresist material is exposed is minimized by keeping the exposure time short in order to avoid polymerizing the entire surface with the high reference beam intensity bias. After exposure, the photoresist material is developed for a long time in order to obtain a sufficient differential etch.

A basic paper disclosing existing techniques appeared in *Applied Optics*, Vol. 9, No. 10, Oct. 1970, pp. 2283–2290, by Bartolini et al., entitled "Embossed Hologram Motion Pictures for Television Playback". As described in that paper, a common use of the photoresist material is as a master hologram from which a metal master may be formed for stamping out inexpensive replica holograms by embossing. Another paper directed to the replication steps entitled "Replication of Relief-Phase Holograms for Prerecorded Video" by Bartolini et al. appeared in the *Journal of the Electrical Chemical Society*, Vol. 120, No. 10, pp. 1408–1413, Oct. 1973.

It is a primary object of the improved photoresist techniques of the present invention to reduce noise and distortion in images reconstructed from photoresist holograms, while maintaining image brightness.

SUMMARY OF THE INVENTION

Briefly, these and additional objects are accomplished by the present invention wherein the average reference and object modified beam intensities are made roughly equal, rather than the high reference beam intensity relative to that of the object modified beam that has been used heretofore, as a first step. A second step of the improved technique exposes the photoresist material as long as possible to the holographic pattern, rather than keeping it short as is the present technique. It is believed that these first two steps maximize the differential that results within the detector between light and dark portions of the holographic pattern. A third step of the improved method develops the exposed photoresist material by etching for only a very short time, such a short etch being made possible by a high differential etch rate that occurs between the exposed and unexposed regions of the material. The resulting improved image quality is believed due to elimination of etching that occurs where it is not desired with existing techniques that utilize a very long etch time to obtain grooves in the surface of the hologram that are deep enough.

Other objects, advantages and features of the improved technique of the present invention will become apparent from the following detailed description which should be taken in conjunction with the accompanying drawings.

BRIEF DESCRIPTION OF THE DRAWINGS

FIG. 1 schematically illustrates the making of a hologram on photoresist material;

FIG. 2 is an enlarged schematic representation of an edge of a photoresist detector that has been exposed to a holographic interference pattern;

FIG. 3 is a schematic representation of an edge view of an exposed photoresist detector that has been developed to form a surface relief hologram; and FIG. 4 shows exemplary intensity variations across a photoresist detector that result from presently used techniques and from those of the improvements of the present invention.

DESCRIPTION OF A PREFERRED EMBODIMENT

Referring to FIG. 1, a standard existing technique for making a hologram in photoresist material is briefly reviewed. A two-dimensional hologram detector is made of a substrate 11 coated with a photoresist material layer 13. The substrate is any suitable material, such as a two-dimensional sheet of Mylar, glass or acrylic. The photoresist layer 13 is applied to the substrate with a thickness of one or two microns. Shipley AZ-1350 positive photoresist is a typical commercially available photoresist. It is applied to the substrate 11 by dipping or some other technique. After the substrate 11 is coated with the liquid photoresist layer 13, the combination is baked in an oven. The coating step is done carefully to avoid any sudden surface relief variations.

According to standard holographic techniques, the photoresist 13 is exposed to a pair of interfering coherent radiation beams 15 and 17 that are coherent with each other. Both beams illuminate the two-dimensional photoresist material 13 and form an interference pattern thereacross. One of the beams, say beam 15, has been modified by an object (not shown). This is accomplished by passing a coherent radiation beam through a transparency, if the object is in that form, or reflecting it from the object if a three-dimensional one. The result is that the object modified beam 15 carries intensity and phase variations across it corresponding to the information that it has of the object. It is an image of this object that is desired to be reconstructed from the hologram after its completion. The second beam 17 is a reference beam that is caused to intersect the object bearing beam 15 at a finite angle with it. The reference beam 17 normally is of uniform intensity across the beam. The beams 15 and 17 are preferably derived from a common laser source in the ultraviolet or deep blue radiation range.

Referring to FIG. 2, the selective solubility of a positive photoresist layer 13 is illustrated. The holographic interference pattern to which the photoresist 13 is exposed results in region 19 having a high degree of solubility to a developer corresponding to the higher intensity portions of the light pattern to which the photoresist was exposed. Similarly, regions 21 have a lesser degree of solubility where the intensity of light to which the photoresist is exposed is low.

After exposure of the photoresist, the material is developed as shown in FIG. 3 by immersing the exposed detector in a developing solution. Such a solution is commercially available as Shiply AZ 303 Developer. The immersion in the developer solution causes the material in the region of greatest solubility to be etched away faster while the regions of lessor solubility are etched more slowly. This results in a normal flat surface 23 of the photoresist layer 13 being etched into a surface relief pattern 25 as shown in exaggerated form in FIG. 3. The entire surface, even portions not previously exposed to light, are etched away some amount (a). In regions corresponding to the dark lines 19 of FIG. 2, more material is etched away to form the bottoms of the grooves of the surface relief pattern 25 of FIG. 3. The depth (b) of these grooves is controlled to be within known limits so that the amount of light that is refracted or reflected into a first order beam is sufficient upon reconstruction of the hologram.

The aspects of FIGS. 1-3 described so far are common both to existing techniques and the present invention. Where the present invention departs from existing techniques is with regard to the relative intensities of the object modified beam 15 and reference beam 17, the duration of exposure of the photoresist to these beams and the length of development time which varies the depth (a)+(b). It has been found that each of these three factors are interrelated and can be optimized to improve the quality of an image reconstructed from a photoresist hologram or a replica thereof.

The beam ratio of the present invention is significantly different from existing techniques. The existing technique is to make the intensity of the reference beam 17 many times the average intensity of the object modified beam 15. The ratio of intensity is generally at least 4 and sometimes as high as 10 or 20. The reason stated for operating with such beam intensity ratios is to make sure that all the information of the object modified beam is recorded in a linear region of the photoresist characteristic curve in order to avoid distortion. However, it has been discovered as part of the present invention that the distortion in the reconstructed optical image that is avoided by this technique is not significant, although it might be significant if the hologram is used for recording certain types of information such as digital data. But for recording optical images, it has been found that this lopsided beam ratio is unnecessary and actually results in causing an undesirable level of image noise and distortion from other factors.

The technique of the present invention contemplates that the average intensity of the object modified beam 15 is substantially equal to that of the reference beam 17. The object modified beam 15 carries alternate bright and dark spots across the beam in accordance with the object information it carries. This intensity variation means that, in accordance with the present invention, there will be a substantial portion of the intensity peaks across the object modified beam as it strikes the photoresist material 13 that are equal to or greater than the intensity of the reference beam at the location of those peaks. This is the condition that is avoided at all costs by others utilizing existing techniques for fear of image distortion. What appears to happen in the reconstructed image at these bright object points is that the overmodulation of the detector material at these points causes a larger portion of the reconstructing light to be diffracted in higher order beams than normal but since these beams are out of the observer's view, they cause little difficulty so long as the overmodulation is not too extreme and does not occur over too much of the object image.

Referring to FIG. 4, the intensity variations of the holographic interference pattern across the surface of the photoresist 13 during exposure are illustrated. A bright spot in the object beam 15 greater than the intensity of the reference beam 17 at that position will cause the overmodulation mentioned above as illustrated by curve 27 of FIG. 4. The lower portion of the interference pattern is folded which does cause some loss of information upon reconstruction but which is not so significant with optical images being reconstructed for viewing. For a portion of the object modified beam 15 that is of the same intensity as the reference beam 17, an intensity variation 29 of the interference pattern shows the ideal circumstance where the darkest part of the fringes are at zero intensity. Other portions of the object bearing beam 15 can be of lesser intensity than that of the reference beam 17, as shown at 31 in FIG. 4. Also shown in FIG. 4 in dotted outline is another curve showing the same interference fringe intensity variations that result from the existing techniques wherein the reference beam is made much brighter in order to provide a bias that avoids the clipping or folding of the bright object modified beam portion 27 and operates in the linear portion of the photoresist characteristic curve.

The significance and advantages of the new beam ratio are discussed below. In practice, the beams are set to be substantially equal by use of an integrating light meter having a target area of about one square centimeter. The intensity of the object modified beam 15 is set to be substantially equal when measured on such a meter as that of the reference beam 17. If a transparency is used as the object from which the object modified beam 15 emerges, the improved beam ratio of the present invention is approximated by setting each of the beams to be substantially equal with the transparency taken out of the object beam. The conditions are satisfied when the hologram is made with the transparency positioned in the object beam.

A second aspect of the hologram constructing technique in which the present invention differs is with regard to the length of exposure of the photoresist detector to the interfering beam of the roughly equal intensity. The present invention causes the photoresist to be exposed as long as practical, a main limitation being the length of time that a mechanical vibration-free environment can be maintained. Existing techniques, on the other hand, teach a short exposure time. The short time is necessary in order to avoid substantially increasing the solubility of the entire photoresist material. This will result from the high reference beam bias level of existing techniques. The present invention, on the other hand, by eliminating this reference beam bias as shown in FIG. 4, makes possible a longer and/or higher intensity exposure. A greater exposure with the beam ratio of the present invention causes the differential solubility of the detector to be greater, a significant advantage.

The third step in which the present invention differs from existing techniques is in the development or etching of the photoresist after exposure is complete. Existing techniques immerse the exposed photoresist in a solution of the Shipley AZ 303 Developer, diluted 4 to 1 with water, for about 20 seconds. According to the present invention, on the other hand, the photoresist is immersed in the developer for from 3 to 6 seconds and even less than 3 seconds in some instances. The total etch depth (a)+(b) of FIG. 3 is made to be less than 0.7 microns. The techniques of the present invention minimize the amount "a" (FIG. 3) of etching that is accomplished in the unexposed regions by keeping the amount of etching to a minimum and also by making sure that these regions have a minimum possible increase in solubility due to exposure to the holographic interference pattern by reducing the bias level of the reference beam intensity. It is believed that this reduction of etching where it is not desired eliminates or substantially reduces reconstructed image noise and distortion. The high differential in intensity of light and dark regions of the holographic interference pattern results in an increased differential etch rate during development that gives the desired groove depth "b" (FIG. 3) with a short development time without the large etch distance "a" that is undesirable.

A major factor in determining the maximum etch depth a+b is explained with reference to FIGS. 1 and 2. If the development time is very long, then the etching will remove material from the entire surface 23 of the photoresist 13, even in the regions which have not been exposed to light. As the etching proceeds downward normal to the surface 23, material is removed in both the dark and light areas.

If the etching removes both a single dark band and a single light band directly beneath it, then, theoretically, the subsequent etched surface is flat across the detector and no surface variations of the type shown in FIG. 3 exist. This result occurs only if the object modified beam 15 (FIG. 1) is a plane wave. However, even for complex object waves, the surface relief is small at this etch depth. This surface leveling is a periodic function of the etch depth. If the differential etch is small, then, the surface relief can never be large no matter how great the total etch time. Any attempt to create a large surface variation by increasing the etch time merely contributes to added noise in the image.

The etch depth at which this first leveling effect occurs depends upon the angles of the object and reference beams. In FIG. 1, if beam 17 makes an angle $\theta_r$ with the photoresist surface, and beam 15 makes an angle $\theta_o$, then the fringes 19 of FIG. 2 are tilted with respect to the surface of 13 at an angle of $$90 + \frac{\theta_r - \theta_o}{2}$$

degrees. The spacing across the surface between fringes is:

$$d = \frac{\lambda}{\cos\theta_o + \cos\theta_r}$$

where $\lambda$ is the wavelength of the radiation used in the hologram construction process. The etch depth for which this first leveling effect occurs is:

$$\frac{\lambda}{\cos\theta_o + \cos\theta_r} \tan\left(90 + \frac{\theta_r - \theta_o}{2}\right)$$

If the problem of leveling is to be avoided then the etch depth ought to be less than $\frac{1}{2}$ of this depth. For visible illumination on the order of 0.4 microns and for extremely shallow object rays (i.e. $\theta_o$ small), and for a reference of large angle (i.e. $\theta_r$ about 120 degrees), this specifies that the etch depth be no greater than about 0.1 microns. This is an atypical case, however, and this value usually falls within the range of 0.4 to 0.7 microns.

According to this technique, the photoresist is removed from the developer after a few seconds and immediately subjected to a water rinse to stop the etching action. Existing techniques contemplate baking the developed photoresist in an oven for a time but it has been found to be preferable not to do any post development baking because it tends to cause some loss of definition in the surface relief pattern. The developed hologram according to the present technique is ready for reconstruction of an optical image directly with visible light or the making from it of a metal master that is used to stamp out replicas from which optical images are then reconstructed.

Although particular aspects of the improvements of the present invention have been described, it will be understood that the invention is entitled to protection within the full scope of the appended claims.

I claim:

1. In the method of constructing a surface relief hologram on a positive photoresist detector wherein the detector is selectively altered by exposure to object modified and reference coherent beams that are coherent with each other and which intersect at a finite angle at the detector, and thence the detector is developed by etching to remove altered portions of the photoresist, the improvement wherein the step of exposing the photoresist includes setting the relative intensity of the object modified and reference beams with a significant number of peaks in intensity across the object modified beam at the detector being greater than the reference beam intensity at the location of those peaks, and wherein the step of developing the exposed photoresist includes application of an etching solution thereto for a short time to etch a maximum of 0.7 microns into the photoresist surface, whereby a desired depth of etch of the altered material is accomplished while minimizing undesired etching of unaltered material.

2. The improved method according to claim 1 wherein the step of exposing the photoresist includes setting substantially equal the average intensities of the object modified and reference beams across at least a portion of the detector.

3. The improved method according to claim 1 wherein the object modified beam is formed by passing an object coherent beam through a transparency and the intensities of the object beam with the transparency removed and of the reference beam are substantially equal across the detector.

4. The improved method according to claim 1 wherein the developing step etches a maximum of 0.4 microns.

5. In the method of constructing a surface relief hologram on a positive photoresist detector wherein the detector is selectively altered by exposure to object modified and reference coherent beams that are coherent with each other and which intersect at a finite angle at the detector, and thence the detector is developed by etching to remove altered portions of the photoresist, the improvement wherein the step of exposing the photoresist includes setting the relative intensity of the object modified and reference beams with a substantial portion of peaks in intensity across the object modified beam at the detector being equal to or greater than the reference beam intensity at the location of those peaks, and wherein the step of developing the exposed photoresist includes application of an etching solution thereto for a short time to etch normal into the photoresist surface a maximum of one-half the distance between two overlaying adjacent regions within the photoresist that received the higher intensity exposure of the pattern of interference between beams, whereby a desired depth of etch of the altered material is accomplished while minimizing undesired etching of unaltered material.

6. In the method of constructing a surface relief hologram on a positive photoresist detector wherein the detector is selectively altered by exposure to object modified and reference coherent beams that are coherent with each other and which intersect at a finite angle at the detector, the object modified beam varying in intensity thereacross according to the characteristics of an object therein, and thence the detector is developed by etching to remove altered portions of the photoresist, the improvement wherein the step of exposing the photoresist includes setting the relative intensity of the object modified and reference beams with one or more peaks in intensity across the object modified beam at the detector being significantly greater than the reference beam intensity at the location of said peak, and further wherein the step of developing the exposed photoresist detector includes application of an etching solution thereto for a short time to etch a maximum of substantially 0.7 microns into the photoresist surface.

7. The improved method according to claim 6 wherein the step of exposing the photoresist includes setting substantially equal the average intensities of the object modified and reference beams across at least a portion of the detector.

8. The improved method according to claim 6 wherein the object modified beam is formed by passing an object coherent beam through an object transparency and the intensities of the object beam with the transparency removed and of the reference beam are substantially equal across the detector.

9. The improved method according to any of claims 6 through 8, inclusive, wherein the step of exposing the photoresist detector to the coherent object modified and reference beams comprises maintaining such exposure as long as it is possible to maintain a mechanical vibration-free environment, whereby said photoresist is caused to have an increased differential solubility and thus requires a reduced amount of etching action to form the desired surface relief pattern.

10. The improved method according to any of claims 6 through 8, inclusive, wherein the developing step etches a maximum of 0.1 microns into the original unexposed photoresist surface.

11. The improved method according to any of claims 6 through 8, inclusive, wherein any processing of the photoresist hologram subsequent to etching avoids baking the photoresist hologram.

* * * * *